United States Patent
Xie et al.

(10) Patent No.: US 10,763,378 B2
(45) Date of Patent: Sep. 1, 2020

(54) DOUBLE PRINTING METHOD AND SCREEN STENCIL FOR IMPROVING THE TENSILE FORCE OF THE ELECTRODE OF SOLAR PANEL

(71) Applicant: Tongwei Solar Energy(Hefei) Co.,Ltd., Hefei (CN)

(72) Inventors: Yaohui Xie, Hefei (CN); GuanLun Zhang, Hefei (CN); Junmin Wu, Hefei (CN); Qing Chang, Heifei (CN)

(73) Assignee: TONGWEI SOLAR ENERGY (HEFEI) CO., LTD., Hefei (CN)

( * ) Notice: Subject to any disclaimer, the term of this patent is extended or adjusted under 35 U.S.C. 154(b) by 48 days.

(21) Appl. No.: 15/779,854

(22) PCT Filed: May 31, 2017

(86) PCT No.: PCT/CN2017/086512
§ 371 (c)(1),
(2) Date: May 30, 2018

(87) PCT Pub. No.: WO2018/218474
PCT Pub. Date: Dec. 6, 2018

(65) Prior Publication Data
US 2019/0363203 A1    Nov. 28, 2019

(51) Int. Cl.
*H01L 31/0224*   (2006.01)
*C03C 8/18*   (2006.01)
(Continued)

(52) U.S. Cl.
CPC ........ *H01L 31/022433* (2013.01); *C03C 8/18* (2013.01); *H01L 31/0201* (2013.01); *H01L 31/18* (2013.01); *C03C 2204/00* (2013.01)

(58) Field of Classification Search
None
See application file for complete search history.

(56) References Cited

U.S. PATENT DOCUMENTS

| 2011/0308601 | A1 | 12/2011 | Kim | |
| 2014/0076231 | A1* | 3/2014 | Hrabi | B41F 15/36 118/504 |
| 2014/0318613 | A1* | 10/2014 | Von Campe | H01L 31/0201 136/256 |

FOREIGN PATENT DOCUMENTS

| CN | 102582229 A | 7/2012 |
| CN | 104247049 A | 12/2014 |
(Continued)

*Primary Examiner* — Jethro M. Pence
(74) *Attorney, Agent, or Firm* — Bayramoglu Law Offices LLC

(57) ABSTRACT

A double printing screen stencil includes a first screen stencil and a second screen stencil. The first screen stencil pattern includes equally spaced fingers. A plurality of bottom electrodes are arranged at the position of the busbar intersecting with the fingers. The first screen stencil pattern further includes at least two aligning points. The second screen stencil pattern includes equally spaced fingers, busbars intersecting with the fingers, aligning points corresponding to the aligning points in the first screen stencil pattern. The fingers are corresponding to those of the first screen stencil and the spacing of the fingers is the same as that of the first screen stencil. When the screen stencil is used in printing, the bottom electrodes are printed at the position of the busbar while the fingers are printed during the primary printing, so as to increase the height of busbar during, the secondary printing.

7 Claims, 5 Drawing Sheets

(51) Int. Cl.
*H01L 31/02* (2006.01)
*H01L 31/18* (2006.01)

(56) References Cited

FOREIGN PATENT DOCUMENTS

| | | | | |
|---|---|---|---|---|
| CN | 204315585 U | | 5/2015 | |
| CN | 205130593 U | | 4/2016 | |
| CN | 205130621 U | * | 4/2016 | .............. B41F 31/36 |
| CN | 205130621 U | | 4/2016 | |
| CN | 205631674 U | * | 10/2016 | ......... H01L 31/0224 |
| CN | 205631674 U | | 10/2016 | |

\* cited by examiner

| Testing Group | Number of the solar cell wafer | Tensile Force N/mm | Average Tensile Force N/mm |
|---|---|---|---|
| Embodiment 6 | 1 | 2.62 | 2.438 |
| | 2 | 2.33 | |
| | 3 | 2.43 | |
| | 4 | 2.3 | |
| | 5 | 2.51 | |
| Embodiment 7 | 1 | 2.46 | 2.486 |
| | 2 | 2.78 | |
| | 3 | 2.38 | |
| | 4 | 2.45 | |
| | 5 | 2.36 | |
| Control Group (without substrate electrode) | 1 | 2.35 | 2.194 |
| | 2 | 2.12 | |
| | 3 | 2.26 | |
| | 4 | 2.06 | |
| | 5 | 2.18 | |

Figure 8

DOUBLE PRINTING METHOD AND SCREEN STENCIL FOR IMPROVING THE TENSILE FORCE OF THE ELECTRODE OF SOLAR PANEL

CROSS REFERENCE TO THE RELATED APPLICATIONS

This application is the national phase entry of International Application No. PCT/CN2017/086512, filed on May 31, 2017, the entire contents of which are incorporated herein by reference.

TECHNICAL FIELD

The present invention relates to the field of solar cell, more particularly, to a double printing method and screen stencil for improving the tensile force of the electrode of solar panel.

BACKGROUND

Currently, solar power is a relatively new renewable energy. Solar silicon wafers are indispensable components for solar cell arrays. Screen stencil printing technology is the commonly used production process of the electrodes in the industrialized manufacturing process of crystalline silicon solar cells. The double printing process is an advanced production technology, in which the front surface electrode is produced by the following steps in order, i.e., primary printing of the front surface electrode, drying; secondary printing of the front electrode, drying, sintering, and the process is completed. The secondary printing is to overlap the fingers printed by the primary printing by printing the fingers once again. Thus, the fingers can be thickened, the broken fingers can be eliminated, the effect of series resistance is reduced, and the efficiency of battery is effectively improved.

However, the existing double screen stencil printing of solar cell prints the front surface fingers (DP1) in the primary printing, and subsequently prints the busbars and fingers (DP2) in the secondary printing. As a result, the busbars are printed only once. An insufficient height will lead to the risk of unqualified tensile force of the positive electrode. If the silver paste formula is modified to have the property of high tensile force and strong corrosivity, although the tensile force can be improved, the efficiency will decrease. If the screen stencil parameters are adjusted, the height of the busbars can be improved to ensure the tensile force of the positive electrode. However, the consumption of silver paste will increase, such that the production costs will go up.

Regarding the dual screen stencil printing of solar cell, how to improve the tensile force of the positive electrode without significantly increasing the production cost or reducing the efficiency of the solar cell is an important issue that needs to be solved urgently and is critical for the development of solar cell.

SUMMARY

The technical problem to be solved by the present invention is to provide a double printing method and screen stencil that improves the tensile force of the electrode in solar panels. The method looks to improve the double screen stencil printing of the solar cell in the prior art, where the busbar is printed only once and the insufficient height increases the chance of the unqualified tensile force of the positive electrode.

In order to solve the above-mentioned technical problems, the technical solution of the present invention is as follows. A double printing screen stencil for improving the tensile force of the electrode of solar panel, characterized in that, the double printing screen stencil includes a first screen stencil and a second screen stencil. The first screen stencil pattern includes equally spaced fingers. A plurality of bottom electrodes are arranged at the position of the busbar intersecting with the fingers. The first screen stencil pattern further includes at least two aligning points. The second screen stencil pattern includes equally spaced fingers, busbars intersecting with the fingers, and aligning points corresponding to the aligning points in the first screen stencil pattern. The fingers are corresponding to those of the first screen stencil and the spacing of the fingers is the same as that of the first screen stencil.

Furthermore, the fingers of the first screen stencil pattern pass through the busbars or are disconnected at the point of the busbars.

Preferably, the bottom electrodes are equally spaced and evenly distributed at the position of the busbar. Furthermore, a length of the bottom electrodes that are parallel to the fingers is equal to a width of the busbars.

Preferably, a shape of the bottom electrodes is selected from the group consisting of rectangle, sawtooth, square, and any combination.

Preferably, the aligning points are arranged around the position of the busbars. The aligning points arranged in the first screen stencil pattern are solid aligning points. The aligning points arranged in the second screen stencil pattern are hollow aligning points.

More preferably, the hollow aligning point and the solid aligning point are round-shaped.

Specifically, the diameter of the hollow aligning points is the same as the diameter of the solid aligning points. Preferably, the diameter of the aligning points is a half of the width of the busbar. More preferably, the diameter of the aligning point ranges between 0.2 mm and 1.5 mm.

Preferably, the amount of the aligning points is four. The four aligning points are evenly distributed around the position of the busbars.

A double printing method for improving the tensile force of the electrode of solar panel, characterized in that, the method includes the following steps. Step one is printing by a first screen stencil, wherein electrode paste passes through the first screen stencil to print a front surface electrode pattern onto a solar cell wafer, so as to print fingers, bottom electrodes, and aligning points. There are a plurality of bottom electrodes distributed at a position of busbars. Step two is printing by a second screen stencil subsequently, wherein the aligning points of the second screen stencil are aligned with the aligning points already formed on the solar cell wafer. The electrode paste passes through the second screen stencil to print the front surface electrode pattern onto the solar cell wafer, so as to print the busbars and the fingers in a further step. Each of the first screen stencil and second screen stencil is a double printing screen stencil according to any one of claims 1-7.

Specifically, the electrode paste for the primary screen stencil printing is preferably selected to be a paste which can penetrate an antireflection film and has a good ohmic contact performance with the silicon substrate. Specifically, the paste is a mixture of silver powder, glass powder, and an organic carrier. Preferably, a mass fraction of the silver powder ranges from 80% to 90%.

A front surface electrode of a solar cell is characterized in that, the front surface electrode is prepared by the above-mentioned method. The front surface electrode includes a busbar pattern and a finger pattern. The height of the busbar pattern is undulating.

Compared with the prior art, the advantages of the present invention are as follows:

(1) In the double printing screen stencil of the present invention, the tensile force of the electrode of the solar panel is improved by setting the bottom electrodes at the position of the busbar in the first screen stencil pattern without substantially adjusting the parameters of the screen stencil, such that when the screen stencil is used in printing, the bottom electrodes are printed at the position of the busbar while the fingers are printed during the primary printing. Thus, the height of busbar is raised during the secondary printing. In such a way, the welding performance of the positive electrode is improved. The tensile force value of the positive electrode can be increased by 0.2-0.3 N/mm. The utilization rate of the electrode paste is improved. The conversion efficiency of the solar cell is improved to a certain extent. The present invention is of great significance in terms of the solar cell, and is worth being popularized and applied. The setting of the aligning points on the first screen stencil pattern and the setting of the corresponding aligning points on the second screen stencil pattern are convenient for fitting the position of the secondary printing with the position of the primary printing, such that the electrode yield rate is improved.

(2) In the double printing screen stencil for improving the tensile force of the electrode of solar panel of the present invention, the fingers of the first screen stencil pattern pass through the busbar or are disconnected at the point of the busbar. Under the condition where the fingers do not pass through the busbar, the production of the screen stencil requires a high precision with the advantage of saving electrode paste. If the fingers pass through the busbar, the production of the screen stencil requires a lower precision, and the production of the screen stencil is easy.

(3) In the double printing screen stencil for improving the tensile force of the electrode of solar panel of the present invention, preferably, the aligning points arranged on the first screen stencil pattern are solid aligning points, and the aligning points arranged on the second screen stencil pattern are hollow aligning points, such that a precise alignment is enabled.

(4) In the double printing method for improving the tensile force of the electrode of solar panel of the present invention, fingers and bottom electrodes located at the position of the busbars are printed during the primary printing, and the fingers and busbars are printed during the secondary printing. In the secondary printing, the height of the busbar has been raised by the primary printing. The welding performance of the positive electrode is improved. The tensile force value of the positive electrode can be increased by 0.2-0.3 N/mm.

(5) In the front surface electrode of the solar cell of the present invention, the tensile force value of the positive electrode is increased, such that the conversion efficiency of the solar cell is improved.

BRIEF DESCRIPTION OF THE DRAWINGS

FIG. 8 is a data list of tensile force test of a cell wafer.

Figure 1:
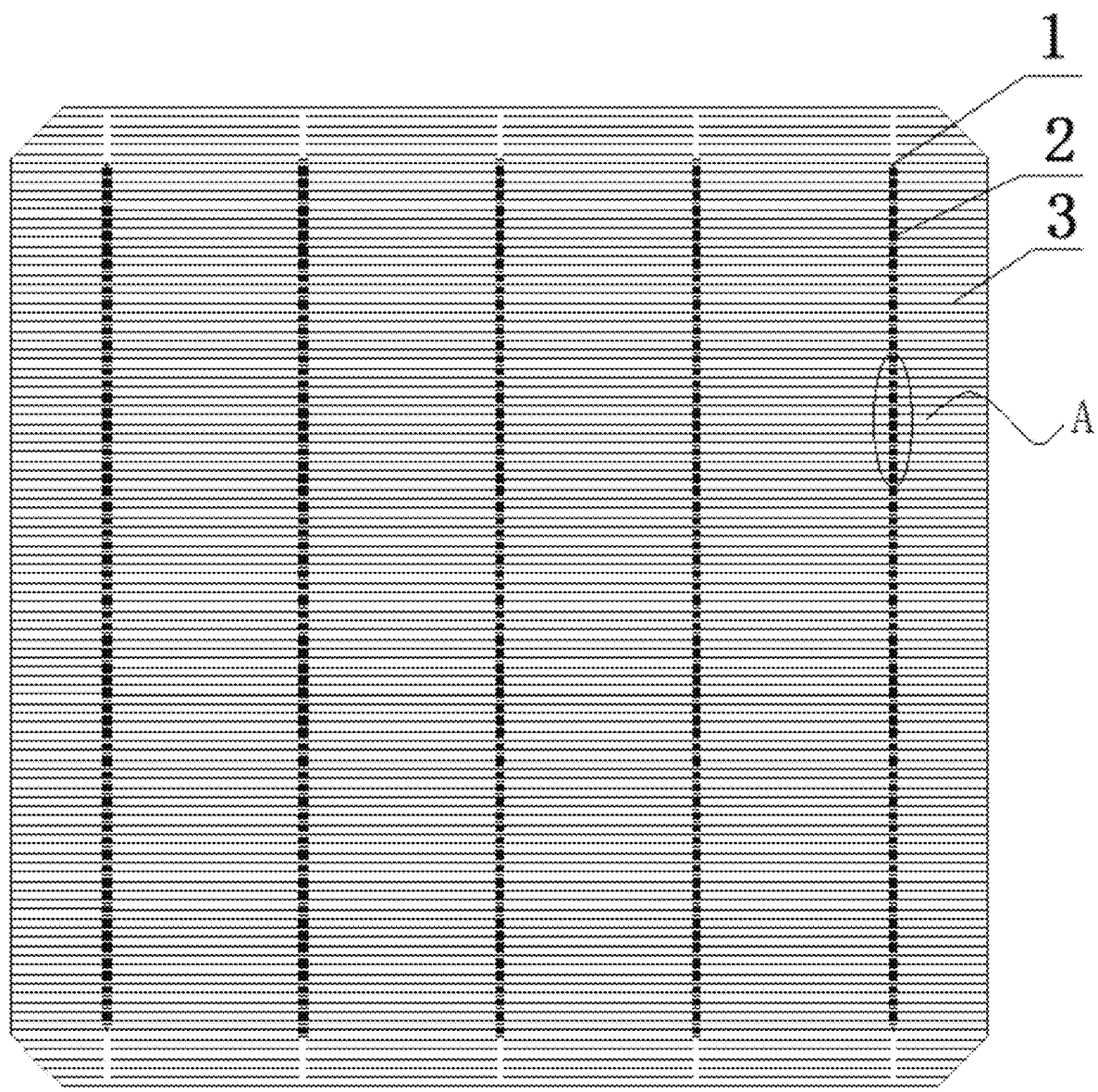
FIG. 1 is a schematic view of a first screen stencil pattern of the present invention.
Figure 2:
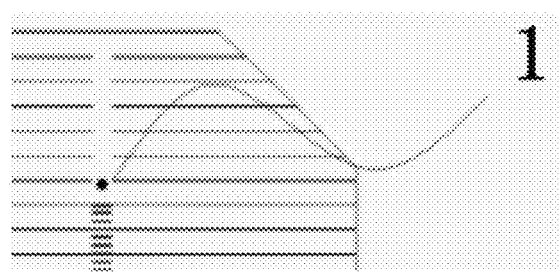
FIG. 2 is a partially enlarged schematic view of an aligning point of the first screen stencil pattern of the present invention.

In the drawings, 1—solid aligning point; 2—bottom electrode; 3—finger; 4—busbar; 5—hollow aligning point.

DETAILED DESCRIPTION

In order to make the technical solution of the present invention clearer, the present invention will be described in further detail with reference to the drawings and embodiments.

Embodiment 1

Figure 3:
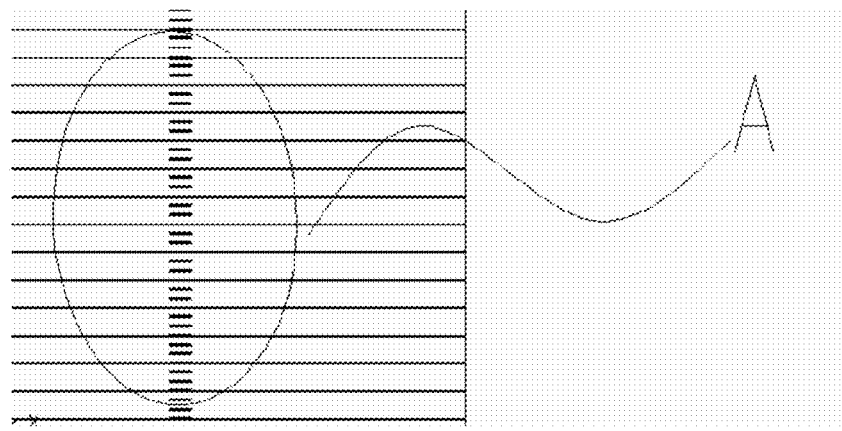
FIG. 3 is a partially enlarged schematic view of A of the first screen stencil pattern of the present invention.
Figure 4:
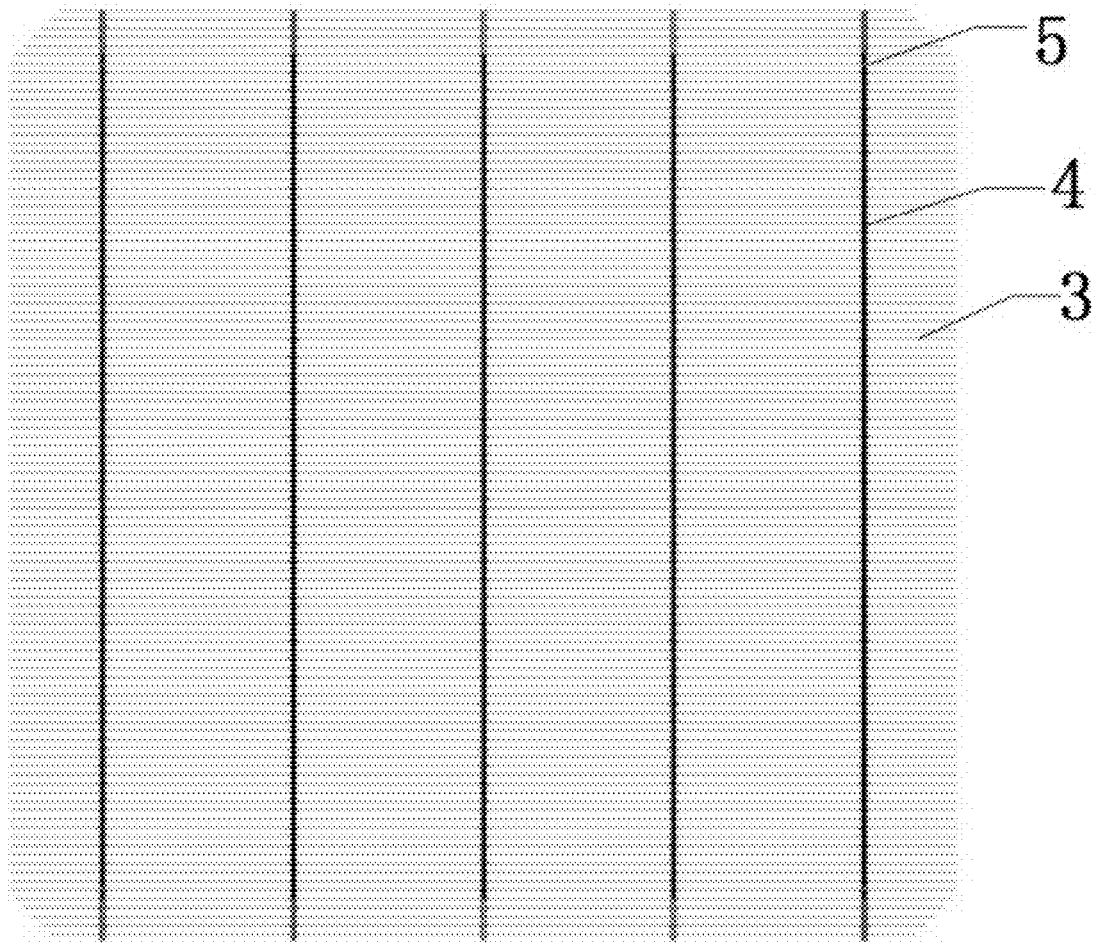
FIG. 4 is a schematic view of a second screen stencil pattern of the present invention.
Figure 5:
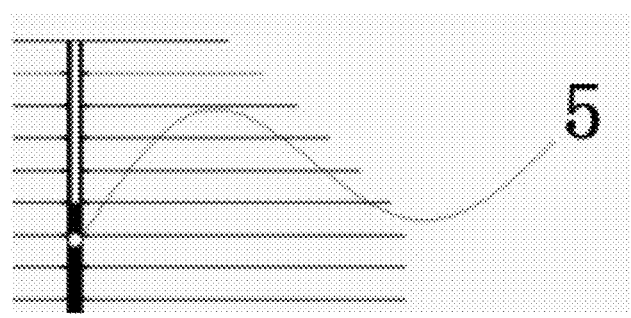
FIG. 5 is a partially enlarged schematic view of a second screen stencil pattern of the present invention.

As shown in FIGS. 1-5, a double printing screen stencil for improving the tensile force of the electrode of solar panel includes a first screen stencil and a second screen stencil. As shown in FIG. 1, a first screen stencil pattern includes equally spaced fingers 3. A plurality of bottom electrodes 2 are arranged at the position of the busbar intersecting with fingers 3. The first screen stencil pattern further includes at least two aligning points. As shown in FIG. 4, a second screen stencil pattern includes equally spaced fingers 3, busbars 4 intersecting with the fingers 3, aligning points corresponding to the aligning points in the first screen stencil pattern. Fingers 3 are corresponding to that of the first screen stencil. The spacing of the fingers is the same as that of the first screen stencil.

Specifically, in the present embodiment, fingers 3 of the first screen stencil pattern pass through the busbars. As a variation, fingers 3 of the first screen stencil pattern also can be disconnected at the point of the busbars.

Preferably, bottom electrodes 2 are equally spaced and evenly distributed at the position of the busbar. The length of the bottom electrodes which is parallel to the fingers is equal to a width of the busbars. FIG. 3 which is a partially enlarged view of part A of FIG. 1 shows that, two bottom electrodes make up a group and are equally spaced and evenly distributed at the position of the busbars.

Bottom electrode 2 is rectangle-shaped. As a variation, the shape of bottom electrode 2 can be any of the sawtooth and square, or any combination of the rectangle, sawtooth, and square.

Specifically, the aligning points are arranged around the position of the busbars. The aligning points arranged in the first screen stencil pattern are solid aligning points 1. The aligning points arranged in the second screen stencil pattern are hollow aligning points 5. Hollow aligning point 5 and solid aligning point 1 are round-shaped. The diameter of hollow aligning point 5 is the same as the diameter of solid aligning point 1. Specifically, the diameter of the aligning points preferably is ½ of the width of the busbar. More preferably, the diameter of the aligning points ranges between 0.2 mm and 1.5 mm.

Preferably, the amount of the aligning points is four. The four aligning points are evenly distributed around the position of the busbars.

Embodiment 2

A double printing screen stencil for improving the tensile force of the electrode of solar panel includes a first screen stencil and a second screen stencil. The first screen stencil pattern includes equally spaced fingers. A plurality of bottom electrodes are arranged at the position where the busbar intersecting with the fingers. The first screen stencil pattern further includes at least two aligning points. The second screen stencil pattern includes equally spaced fingers, busbars intersecting with the fingers, and aligning points corresponding to the aligning points in the first screen stencil pattern. The fingers are corresponding to those of the first screen stencil. The spacing of the fingers is the same as that of the first screen stencil.

Figure 6:
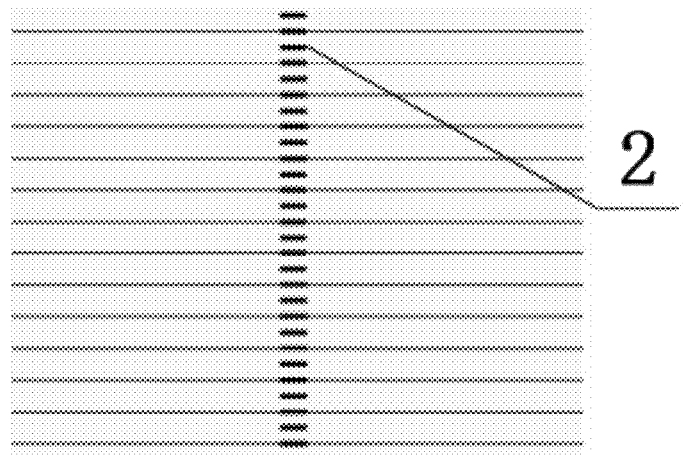
FIG. 6 is a schematic view of the bottom electrodes of the first screen stencil pattern of Embodiment 2.

Specifically, the amount of the fingers of the first screen stencil pattern is 106. The fingers are equally spaced and paralleled distributed. Moreover, the fingers pass through the busbars. As shown in FIG. 6, bottom electrodes 2 are rectangle-shaped with the length of 0.7 mm and the width of 0.2 mm. Moreover, the bottom electrodes 2 are evenly distributed at the position of the busbars with the interval of 0.74 mm. In the present embodiment, four solid aligning points are arranged around the position of the busbars in the first screen stencil pattern.

The amount of the fingers of the second screen stencil pattern is 106. Similar to the first screen stencil, the fingers of the second screen stencil pattern are also equally spaced and paralleled distributed. Moreover, five busbars are perpendicular to the fingers. The width of the busbar is 0.7 mm. Four hollow aligning points are arranged around the position of the busbars. The hollow aligning points are corresponding to the solid aligning points of the first screen stencil one by one.

Embodiment 3

A double printing screen stencil for improving the tensile force of the electrode of solar panel includes a first screen stencil and a second screen stencil. The first screen stencil pattern includes equally spaced fingers. A plurality of bottom electrodes are arranged at the position where the busbar intersecting with the fingers. The first screen stencil pattern further includes at least two aligning points. The second screen stencil pattern includes equally spaced fingers, busbars intersecting with the fingers, and aligning points corresponding to the aligning points in the first screen stencil pattern. The fingers are corresponding to those of the first screen stencil. The spacing of the fingers is the same as that of the first screen stencil.

Figure 7:
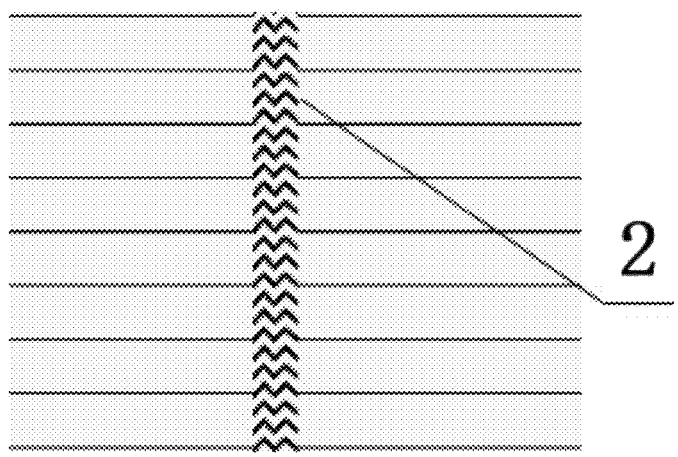
FIG. 7 is a schematic view of the bottom electrodes of the first screen stencil pattern of Embodiment 3.

Specifically, the amount of the fingers of the first screen stencil pattern is 106. The fingers are equally spaced and paralleled distributed. Moreover, the fingers pass through the busbars. As shown in FIG. 7, bottom electrodes 2 are sawtooth-shaped with the length of 0.7 mm. Moreover, the bottom electrodes are evenly distributed at the position of the busbars with the interval of 0.5 mm. In the present embodiment, four solid aligning points are arranged around the position of the busbars in the first screen stencil pattern.

The amount of the fingers of the second screen stencil pattern is 106. Similar to the first screen stencil, five busbars are perpendicular to the fingers. The width of the busbar is 0.7 mm. Four hollow aligning points are arranged around the position of the busbars. The hollow aligning points are corresponding to the solid aligning points of the first screen stencil one by one.

Embodiment 4

A double printing method for improving the tensile force of the electrode of the solar panel, which uses the double printing screen stencil of Embodiment 2, includes the following steps. Step one, printing by a first screen stencil, wherein the electrode paste passes through the first screen stencil to print a front surface electrode pattern onto a solar cell wafer, so as to print the fingers, bottom electrodes, and four solid aligning points. There are a plurality of bottom electrodes respectively distributed at a position of busbars. Step two, printing by a second screen stencil subsequently, wherein after a High-Definition Camera captures the four solid aligning points, the solar cell wafer is automatically adjusted to a proper position to achieve an accurate alignment with the hollow aligning points of the second screen stencil. After that, the electrode paste passes through the second screen stencil to print the front surface electrode pattern onto the solar cell wafer so as to further print the busbars and the fingers.

Embodiment 5

A double printing method for improving the tensile force of the electrode of the solar panel, which uses the double printing screen stencil of Embodiment 3, includes the following steps. Step one, printing by a first screen stencil, wherein the electrode paste passes through the first screen stencil to print a front surface electrode pattern onto a solar cell wafer, so as to print the fingers, bottom electrodes, and four solid aligning points. There are a plurality of bottom electrodes respectively distributed at a position of busbars. Step two, printing by a second screen stencil subsequently, wherein after a High-Definition Camera captures the four solid aligning points, the solar cell wafer is automatically adjusted to a proper position to achieve an accurate alignment with the hollow aligning points of the second screen stencil. After that, the electrode paste passes through the second screen stencil to print the front surface electrode pattern onto the solar cell wafer so as to further print the busbars and the fingers.

Embodiment 6

The front surface electrode of the solar cell, which is prepared by the double printing method for improving the tensile force of the electrode of the solar panel of Embodiment 4, includes a silicon substrate. The size of the silicon substrate is 156.75 mm*156.75 mm. The amount of the busbars is 5. The width of the busbars is 0.7 mm. The amount of fingers is 106. The busbars have an undulating pattern. At the position where the height of the busbar is equal to the height of the fingers, the busbar is strip-shaped with the width of 0.2 mm and the interval of 0.74 mm.

Embodiment 7

The front surface electrode of the solar cell, which is prepared by the double printing method for improving the tensile force of the electrode of the solar panel of Embodiment 5, includes a silicon substrate. The size of the silicon substrate is 156.75 mm*156.75 mm. The amount of the busbars is 5. The width of the busbars is 0.7 mm. The amount of fingers is 106. The busbars have an undulating pattern. At the position where the height of the busbar is equal to the height of the fingers, the busbar is sawtooth-shaped with the interval of 0.5 mm.

Embodiment 8

Production and Test of Solar Cell Wafer

1. Removing the mechanical damaged layer and the texturization: NaOH solution with a concentration of 30-50 g/L is used to remove the mechanical damaged layer of the silicon wafer surface. NaOH solution with a concentration of 15-20 g/L is used to corrode the silicon wafer, so as to form a rough texture on the surface. Next, HCL solution with a concentration of 70-85 g/L is used for cleaning to remove the metal ions on the surface. Finally, ion water is used for cleaning. After that, drying is conducted.

2. The n-type layer is formed on the surface of the p-type silicon wafer by the high temperature diffusion method of the phosphorus oxychloride liquid source. The diffusion temperature is 830° C. The time period is 300 minutes. The square resistance is controlled in the range of 86-92Ω.

3. The n-type silicon at the edge of the silicon wafer and the phosphosilicate glass on the surface of silicon wafer are etched. A mixed solution of $HNO_3$ and HF is used to remove the PN junction at the edge and the back surface. The concentration of $HNO_3$ in the solution is 340-390 g/L. The concentration of HF in the solution is 40-50 g/L. The etching temperature is 5-9° C. The etching amount is controlled at 1.3-1.6 g. KOH solution with a concentration of 5% is used to wash off the porous silicon on the surface of the silicon wafer, and neutralize the preceding acid. HF solution with a concentration of 5% is used to remove the PSG (phosphosilicate glass) on the surface.

4. The silicon nitride is deposited on the front surface of the silicon wafer with PECVD. The thickness is 75-96 nm. The refractive index is 2.0-2.3.

5. The back surface electrode is printed. The drying is conducted.

6. The back field is printed. The drying is conducted.

7. The front surface electrode is printed for a second time. The double printing processing method of Embodiment 4 and Embodiment 5 are used to conduct the printing, respectively.

8. Drying and sintering are conducted to achieve the solar cell having front surface electrode described in Embodiment 5 and Embodiment 6, respectively.

9. Test

The solar cell having front surface electrode described in Embodiment 6 and Embodiment 7 and a control group of solar cell without the bottom electrode are tested. The testing method is that, welding the welding tape on the busbar of the solar cell wafer, conducting peel force testing at 180 degrees on the welded solar cell wafer, collecting 200 data points for each group of data, and then calculating the mean value. The test data is shown in FIG. 8, and the tensile force of the solar cell produced by arranging the rectangle-shaped bottom electrode at the position of the busbars of the first screen stencil is 2.438 N/mm. The tensile force of the solar cell produced by arranging the sawtooth-shaped bottom electrode at the position of the busbars of the first screen stencil is 2.438 N/mm. The tensile force of the solar cell of the control group produced by arranging the first screen stencil without the bottom electrode is 2.194 N/mm. Thus, the tensile force is increased by 0.244 N/mm, 0.292 N/mm, respectively.

In view of the above, with the screen printing in which the bottom electrode is arranged at the position of the busbars of the first screen stencil, the bottom electrode is printed at the position of the busbars while the fingers are primarily printed, such that the height of the busbars is raised in a secondary printing. The welding performance of the positive electrode is improved. The tensile force of the positive electrode can be increased by 0.2-0.3 N/mm.

The above examples are only specific embodiment of the present invention. Apparently, the present invention is not limited to the above embodiments. All variations that are directly derived or contemplated from the disclosure of the present invention made by those skilled in the art should fall within the scope of the present invention.

What is claimed is:

1. A double printing screen stencil for improving a tensile force of an electrode of a solar panel, comprising:
    a first screen stencil; and
    a second screen stencil;
    wherein,
    the first screen stencil includes equally spaced first finger patterns;
    the first screen stencil further includes at least two first aligning points;
    the second screen stencil includes equally spaced second finger patterns, busbar patterns intersecting with the second finger patterns, and at least two second aligning points are provided corresponding to the first aligning points of the first screen stencil;
    the second finger patterns of the second screen stencil correspond to the first finger patterns of the first screen stencil;
    the first screen stencil further includes a plurality of bottom electrode patterns arranged at positions on the first screen stencil corresponding to positions where the busbar patterns intersect with the second finger patterns on the second screen stencil; and
    a spacing between the second finger patterns of the second screen stencil is same as a spacing between the first finger patterns of the first screen stencil.

2. The double printing screen stencil for improving the tensile force of the electrode of the solar panel of claim 1, wherein
    the plurality of bottom electrode patterns are equally spaced and evenly distributed; and
    a length of each of the plurality of bottom electrode patterns is equal to a width of the busbar patterns, wherein each of the plurality of bottom electrode patterns is parallel to the first finger patterns.

3. The double printing screen stencil for improving the tensile force of the electrode of the solar panel of claim 1, wherein
    a shape of each of the plurality of bottom electrode patterns is selected from the group consisting of a rectangle, a sawtooth, a square, and any combination thereof.

4. The double printing screen stencil for improving the tensile force of the electrode of the solar panel of claim 1, wherein
    the first aligning points and the second aligning points are arranged around the position of the busbar patterns;
    the first aligning points arranged in the first screen stencil are solid aligning points; and
    the second aligning points arranged in the second screen stencil are hollow aligning points.

5. The double printing screen stencil for improving the tensile force of the electrode of the solar panel of claim 4, wherein
- the hollow aligning points and the solid aligning points are round-shaped; and
- a diameter of the hollow aligning points is the same as a diameter of the solid aligning points.

6. The double printing screen stencil for improving the tensile force of the electrode of solar panel of claim 5, wherein
- an amount of the first aligning points and the amount the second aligning points is four; and
- the four first aligning points and the four second aligning points are evenly distributed around the positions of the busbar patterns.

7. The double printing screen stencil for improving the tensile force of the electrode of the solar panel of claim 2, wherein
- a shape of each of the plurality of bottom electrode patterns is selected from the group consisting of a rectangle, a sawtooth, a square, and any combination thereof.

* * * * *